Dec. 8, 1964 E. A. J. MARCATILI 3,160,826
MICROWAVE AMPLIFIER AND OSCILLATOR UTILIZING
NEGATIVE RESISTANCE DEVICE
Filed March 22, 1962 2 Sheets-Sheet 1

INVENTOR
E.A.J. MARCATILI
BY
Sylvan Sherman
ATTORNEY

INVENTOR
E.A.J. MARCATILI
BY
Sylvan Sherman
ATTORNEY

United States Patent Office 3,160,826

Patented Dec. 8, 1964

3,160,826

MICROWAVE AMPLIFIER AND OSCILLATOR UTILIZING NEGATIVE RESISTANCE DEVICE

Enrique A. J. Marcatili, Fair Haven, N.J., assignor to Bell Telephone Laboratories, Incorporated, New York, N.Y., a corporation of New York Filed Mar. 22, 1962, Ser. No. 181,589

12 Claims. (Cl. 330—61)

This invention relates to microwave amplifiers and more particularly to microwave amplifiers utilizing negative resistance diodes as the active elements.

In the last few decades the electronics art has undergone a virtual revolution in the field of microwaves. This process has been accelerated with the discovery of the tunnel effect and the invention of the tunnel diode early in 1958. Since that time the tunnel diode, also sometimes called the "Esaki diode"—first described by Leo Esaki in an article entitled "New Phenomenon in Narrow Germanium p-n Junctions," published January 15, 1958, in vol. 109 of the Physical Review at page 603—has found application as the active element in microwave oscillators, amplifiers and switches.

In addition to the Esaki diode, many other two terminal devices, which will be characterized herein as negative resistance diodes, are known to exhibit regions of negative dynamic resistance in their characteristic voltage-current curve. Such devices include the pnpn type diode and certain germanium diodes known in the art. While devices such as these can, in general, be used in practicing the present invention, for purposes of illustration the Esaki diode will be referred to.

In the past, Esaki diode microwave amplifier structures have taken many forms including diodes mounted within coaxial lines and cavities of varying configuration. Esaki diodes have also been mounted across strip transmission lines and within hollow waveguides. (See, for example, Hines, M. E., "High-Frequency Negative-Resistance Circuit Principles for Esaki Diode Applications," Bell System Technical Journal, vol. 39, May 1960, pp. 477–513; and Burrus, C. A., and Trambarulo, R. F., "A Millimeter-Wave Esaki Diode Amplifier," Proceedings of the Institute of Radio Engineers, vol. 49, June 1961, pp. 1075–1076.)

All of these amplifier structures enjoy certain advantages such as low-noise figure, ability to operate at high microwave frequencies and very low power requirements. Along with the advantage of low power requirements for such structures, there is also the disadvantage of low maximum power output. Heretofore, most of the development work in amplifiers utilizing negative resistance diodes has been concerned with increasing their frequency range rather than with increasing their power handling capabilities.

Accordingly, it is one of the objects of the present invention to increase the power handling capability of microwave amplifiers using negative resistance diodes.

One obvious method of increasing the power output of a microwave amplifier is simply to place a number of negative resistance diodes in parallel. Such diodes, however, are low impedance devices and the more diodes one places in parallel the lower the impedance of the combination becomes. Since the diodes must be matched to a transmission path or energy propagating structure of a much higher impedance, it is seen that such matching means must become more and more elaborate in order to compensate for the higher degree of mismatch which occurs if paralleled negative resistance diodes are used. This, in turn, leads to undesirable band limiting effects.

Another method of increasing the power output of microwave amplifiers is to connect a number of negative resistance diodes in series relationship. This method appears to be more attractive than the parallel method; however, certain problems still arise, such as providing individual bias to each diode of the combination and providing means for mounting and tuning the diodes.

It is, therefore, a further object of the present invention to provide improved means for serially connecting negative resistance diodes in a microwave amplifier.

It is another object of the present invention to provide a negative resistance diode amplifier which is tunable over a wide range of frequencies.

In general, the above objects are accomplished in accordance with the principles of the present invention by mounting a plurality of negative resistance diodes in separate slots in a given transverse region of a signal wave transmission path and wherein each diode is separately tuned and matched to the path.

In the basic embodiment, utilizing a single nonlinear impedance element such as a diode, a slot or iris is formed in an outer wall of the wave path so that a portion of the propagating wave energy is coupled thereto. By virtue of this coupling, an electromagnetic field whose magnitude is proportional to the magnitude of the propagating energy is set up within the slot. A diode displaying a negative dynamic resistance over a portion of its operating range is then mounted directly in the slot so that it is, in turn, coupled to the electromagnetic field existing therein. By virtue of the known amplifying properties of negative resistance diodes, such as the above-mentioned Esaki diode, the wave energy which is coupled into the slot containing the diode is amplified and coupled back into the wave path. Means for tuning the slot and diode are provided by an adjustable cavity mounted external to the wave path just behind the slot. In this manner the slot and cavity function as a parallel resonant circuit. The dimensions of the slot and cavity together with the loading provided by the diode determine the center frequency of the band of amplification.

In keeping with the principles of the present invention, the power handling capability of the basic amplifier is increased by coupling additional slots or irises to the wave path. Specifically, a plurality of slots are formed in the outer conductor of the coaxial line or waveguide which constitutes the wave path so that they lie in the same transverse region of the wave path. Diodes are placed in each of the slots in the manner indicated above and the slot-diode combinations are backed by one or more adjustable cavities. In this manner, the diodes, though in series, are individually coupled and matched to the wave path, thereby avoiding the undesirable loading effects mentioned above. In addition, the fact that each diode is mounted in a separate slot allows each to be biased separately in order to compensate for minor differences in diode characteristics.

The above mentioned and other features and objects of this invention will become more apparent by reference to the following description taken in conjunction with the accompanying drawings, in which.

Figures 1, 2:
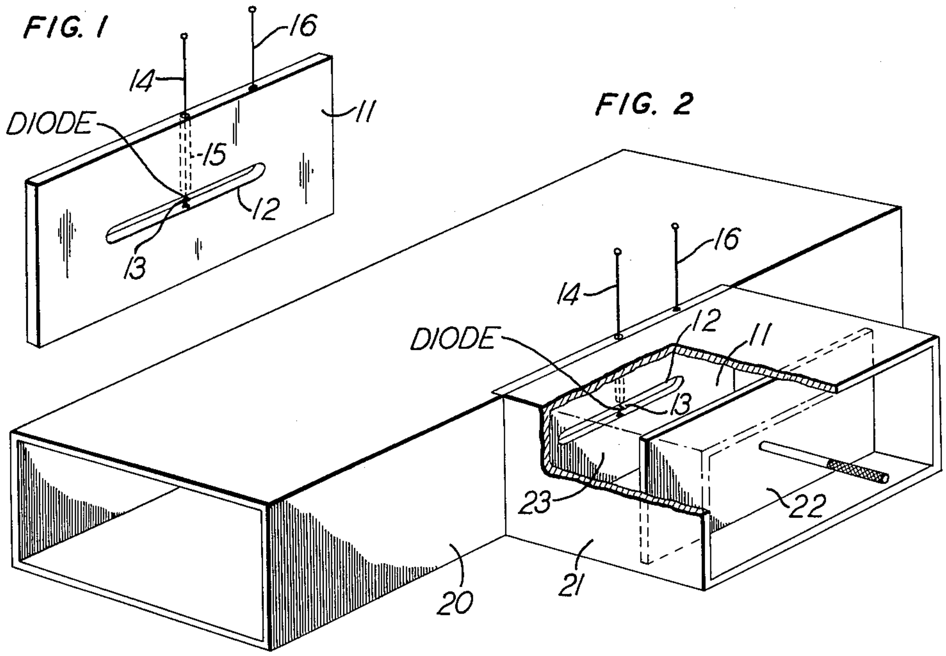
FIG. 1 is a pictorial illustration of an Esaki diode mounted in a slot formed in a conducting wafer.
FIG. 2 is a pictorial illustration of one embodiment of the present invention showing the structure of FIG. 1 mounted in a side wall of a rectangular waveguide.

Referring more specifically to the drawings, FIG. 1 shows a wafer 11 of substantially rectangular transverse dimensions. Wafer 11 is constructed of a material such as copper having a high conductivity at microwave frequencies. A slot or iris 12 is formed in wafer 11 and a diode 13 mounted between the two longer surfaces thereof, so that the high frequency currents flowing across the narrow dimension of the slot flow through the diode. Diode 13 is of a type having a voltage-current characteristic which includes a negative dynamic resistance region. The dimensions of slot 12 are determined by the frequency band over which the device is intended to operate. Its position in wafer 11 and the position of diode 13 within slot 12 can be varied; however, for the purposes of illustration, slot 12 and diode 13 are shown centered in wafer 11.

Bias voltage for diode 13 is applied between lead 16, which is conductively attached to wafer 11, and lead 14, which passes through wafer 11 by means of feed-through bushing 15. Bushing 15 functions as a by-pass capacitor and enables the direct curent biasing current to pass through to diode 13 while at the same time acting as a short circuit for currents in the microwave frequency regions. A by-pass structure suitable for this purpose is disclosed in the copending application of F. A. Braun and R. F. Trambarulo, Serial No. 146,768, filed October 23, 1961.

The basis principles underlying the invention may be explained with reference to FIG. 2 wherein wafer 11 is shown mounted in a side wall of a conductively bounded rectangular waveguide 20. For convenience, the numbering of corresponding components has been carried over from FIG. 1 to FIG. 2. In this embodiment the wafer is oriented so that the long dimension of slot 12 is parallel to the longitudinal axis of the waveguide. Preferably, the inside surface of wafer 11 and the waveguide wall are flush so as to provide a continuously smooth inside surface substantially free of discontinuities. When mounted on the waveguide as shown, wafer 11 serves as a portion of the waveguide wall.

It is obvious, of course, that slot 12 can be formed directly in the waveguide wall, thereby obviating the necessity for a separate wafer. Practically speaking, however, waveguide walls are usually too thin to permit the necessary drilling and machining. This, coupled with the fact that it is easier to perform the machining operations on a small wafer rather than on a bulkier section of waveguide, makes the former type of structure preferable.

Another conductively bounded rectangular waveguide section 21 is shown abutting waveguide 20 at a right angle and contiguous to slot 12 so that waveguide sections 20 and 21 are electromagnetically coupled by means of slot 12. Section 21 is provided with a movable plunger 22 which can be adjusted so as to vary the longitudinal distance between itself and wafer 11.

It is seen that waveguide section 21, together with plunger 22 form a cavity 23. In particular, slot 12 and cavity 23 form a parallel resonant circuit, the resonant frequency of which is determined by the dimensions of slot 12 and cavity 23, together with the loading provided by diode 13.

Diode 13 is supplied with a direct current biasing voltage from a biasing source (not shown) by means of leads 14 and 16. Such a biasing source can consist of a battery or other source of low voltage direct current well known in the art. The function of the biasing source is to bias diode 13 in the region of the negative resistance characteristic. If the negative resistance region were perfectly linear, the exact bias point would preferably be in the center thereof. However, in the practical case, the exact bias point may be somewhat higher or lower depending upon the individual diode.

In operation, electromagnetic energy having a frequency spectrum extending over a given range is propagated through waveguide 20. Preferably, this energy is propagated in the dominant $TE_{10}$ wave mode, since the side wall currents induced by energy in this mode are perpendicular to the long dimension of slot 12. In this manner, a variable electric field, the magnitude of which is proportional to the magnitude of the propagating energy, is set up across diode 13. Due to the negative resistance characteristic of the diode, this energy is amplified and coupled back into waveguide 20. Not all of the energy coupled back into waveguide 20 propagates toward the ultimate load, however. A portion of this energy tends to propagate in the opposite direction. It will be explained below in connection with FIG. 5 how this effect can be compensated for.

Cavity 23 serves a triple function—first, it matches the impedance of slot 12 and diode 13 to the characteristic impedance of waveguide 20; secondly, it determines to some extent the center frequency of the band of amplification of the device; and, thirdly, cavity 23 prevents radiation and the loss of energy which would normally occur when a slot or iris exists in a waveguide wall.

In practice, slot 12 need not be rectangular but can assume other configurations well known in the art. Slot 12, however, is advantageously proportioned so that it is resonant at some frequency higher than the highest frequency to be amplified. In the case of the rectangular slots shown in the illustrative embodiments of the invention, the length (i.e., the longer dimension) of each slot is preferably about one-half wavelength at this highest frequency. Generally speaking, the height, or shorter dimension, of each slot is proportioned so that it is just large enough to accommodate the diode. In practice, this dimension is of the order of a few hundredths of a wavelength, depending upon the frequency of operation. The loading provided by diode 13 and cavity 23 serves to bring the resonant frequency of the combination down to the desired frequency to be amplified.

The bandwidth of the amplifier can be broadened by decreasing either the height or width of waveguide 20. If the width is decreased, however, it is important not to decrease it to such an extent that the guide will be cut off for the propagating wave energy or that oscillation occurs. It should also be mentioned that if the height of guide 20 is decreased, the height of wafer 11 and guide 21 can also be decreased accordingly.

Figure 3:
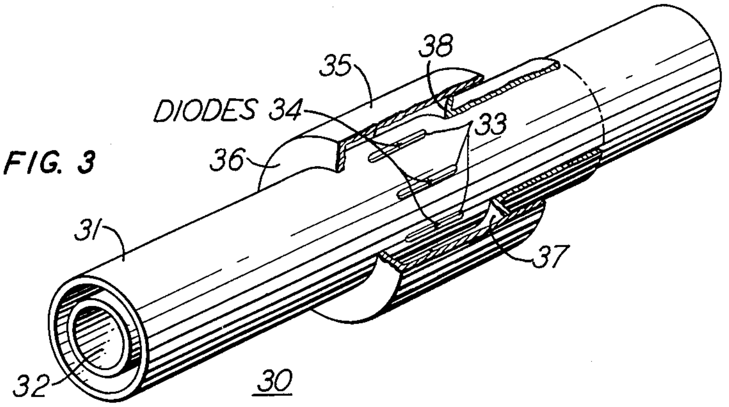
FIG. 3 is a pictorial illustration of another embodiment of the present invention utilizing a plurality of diodes mounted in a coaxial waveguide.

In FIG. 3 there is shown an embodiment of the invention which makes use of a plurality of negative resistance diodes. In this embodiment a coaxial waveguide 30 consisting of an outer conductor 31 and an inner conductor 32 serves as the wave propagating structure. Slots 33 of substantially identical dimensions are symmetrically disposed around the periphery of outer conductor 31 so that their long dimensions are parallel to the longitudinal axis of the guide, and their projections on such axis are coextensive.

Slots 33 can be formed directly in outer conductor 31 if the wall is thick enough. Alternatively, the slots can be formed in wafers similar to wafer 11 of FIG. 1 but having a curved surface that conforms to the curve of outer conductor 31. Each assembly can then be mounted in conductor 31 in slots large enough to accommodate the entire wafer, thereby providing a substantially smooth and continuous surface.

Diodes 34 are mounted in each of slots 33 in a manner substantially identical to that described above in connection with FIG. 1. For the sake of clarity, the leads by which the diodes are supplied with biasing power are not shown. Likewise, the means by which inner conductor 32 is held in place is not shown. Such means can, however, comprise any of the low-loss dielectric beads or spacers well known in the art.

A cylindrical conducting element 35 which is shown partially broken away in FIG. 3 is disposed around outer conductor 31 in the vicinity of slots 33. Cylinder 35 is fitted with an annular conducting ring 36 which conductively joins cylinder 35 at one end thereof to outer conductor 31. A movable annular ring 38 which can be fitted with contacting brushes conductively shorts the other end of cylinder 35 to outer conductor 31. The resulting structure is, then, a coaxial cavity 37 surrounding diodes 34 and slots 33.

In operation, energy in the $TE_{01}$ coaxial circular electric wave mode is propagated through coaxial waveguide 30 between conductors 31 and 32. The wall currents induced by the propagating wave energy in this mode are, as in the case of the previous embodiment, perpendicular to the long dimension of the slots. An electric potential appears across diodes 34 by virtue of the electromagnetic field set up across slots 33. Again, the combination of slots 33, diodes 34 and cavity 37 acts as a tuned amplifier, the resonant frequency of which is determined by the dimensions of slots 33 and cavity 37 and the parameters of diodes 34. After amplification, the wave energy is coupled back into coaxial line 30.

Due to the fact that each individual diode 34 has slightly different characteristics they cannot all be perfectly tuned with a single means such as cavity 37. By providing means for adjusting the bias voltage for each diode separately, this effect can be reduced to a minimum.

A higher degree of power handling capability is afforded by the amplifier structure of FIG. 3 than by the previous embodiment by virtue of the larger number of diodes utilized. When oriented in outer conductor 31 as shown, the plurality of negative resistance diodes are effectively in series relationship with respect to each other and the power output of the combination is a function of the power output of an individual diode multiplied by the number thereof. Since the slots are oriented in outer conductor 31 so that their long dimensions are parallel to the longitudinal axis of waveguide 30, maximum coupling is obtained when the wall currents are circumferential. The $TE_{01}$ circular electric mode induces just such currents. Furthermore, these wall currents, and consequently the coupling to the slots, are greatest when coaxial waveguide 30 is near cut-off for this mode. In practice therefore, it is generally advantageous to operate slightly above cut-off for the $TE_{01}$ wave mode.

It should be pointed out that coaxial waveguide 30 could instead take the form of a simple hollow circular waveguide. For a given frequency, however, the size of a circular waveguide and consequently the number of slots which can be spaced around it is limited if the guide is to remain near cut-off for the circular electric $TE_{01}$ mode. With a coaxial waveguide, on the other hand, the diameter of the outer conductor and the number of slots can be made arbitrarily large while still operating near cut-off for the $TE_{01}$ coaxial circular electric wave mode even though the frequency remains unchanged. This is due to the fact that the cut-off frequency of a coaxial waveguide operating in the $TE_{01}$ mode is determined by the spacing between the inner and outer conductors. Thus, the diameter of outer conductor 31 in FIG. 3 can be made arbitrarily large provided the diameter of inner conductor 32 is also made correspondingly large.

Figure 4:
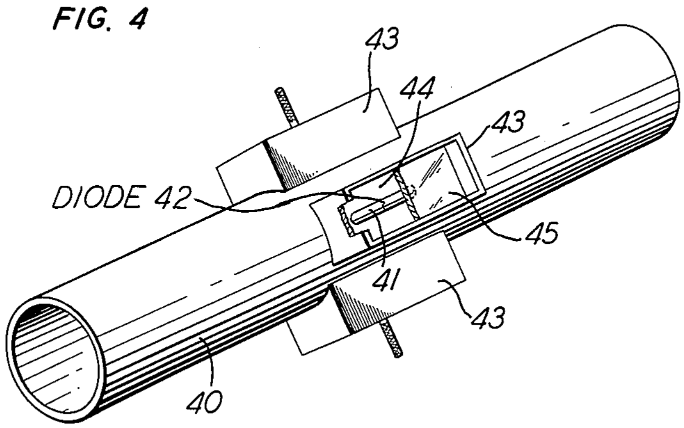
FIG. 4 shows, in pictorial view, still another embodiment of the present invention utilizing a circular waveguide.

For some purposes, however, it may be advantageous to utilize a simple, circular waveguide rather than a coaxial waveguide. In FIG. 4 there is shown, in a pictorial view, still another embodiment of the present invention wherein a simple, hollow conductively bounded circular waveguide 40 is utilized.

Slots 41, of substantially identical dimensions, are spaced symmetrically around the periphery of waveguide 40 with their long sides parallel to the waveguide axis. For purposes of illustration, four slots have been indicated. However, this number should not be considered as in any way limiting the scope of the invention.

As was pointed out above, these slots can be cut directly into the guide wall or formed in conducting wafers which are then inserted into the wall of guide 40. Diodes 42 are mounted in each of the slots 41 in the manner previously indicated so that in the presence of an electromagnetic field across the slot, an electric potential is developed across the diode electrodes. Again, for the purposes of clarity, the biasing supply and connections have been omitted from FIG. 4.

Conductively bounded rectangular waveguide sections 43 abut upon guide 40 behind each of the slot-diode combinations. These waveguide sections are provided with movable shorting pistons 45. The waveguide sections 43 and pistons 45 form, in this manner, adjustable cavities 44 adjacent to each of slots 41.

The embodiment of FIG. 4 operates in a manner quite similar to those of FIGS. 2 and 3, in that each of the slot-diode-cavity combinations functions as a tuned amplifier. As in the case of the embodiment of FIG. 3, the energy propagating within guide 40 is preferably, though not necessarily, in the $TE_{01}$ circular electric wave mode.

It was mentioned in connection with the embodiment of FIG. 2 that a portion of the amplified wave energy coupled back into the wave path propagates therein in the direction of the source rather than in the direction of the ultimate load. Ordinarily, this effect would be undesirable since the result is that not all of the useful power is available to the load. The same result is true of the embodiments illustrated in FIGS. 3 and 4.

Many methods of eliminating or utilizing that portion of the amplified signal which is otherwise objectionable due to its direction of propagation can be devised by those skilled in the art. Devices such as microwave isolators and circulators which can be utilized in accomplishing this end are those discussed in an article by Fox, A. G., Miller, S. E., and Weiss, M. T., entitled "Behavior and Applications of Ferrites in the Microwave Region," Bell System Technical Journal, vol. 34, January 1955, pp. 5–103. One well known method is illustrated by the schematic diagram of FIG. 5.

Figure 5:
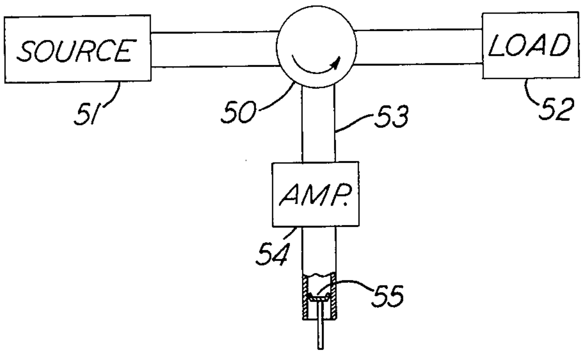
FIG. 5 is a schematic illustration showing one means by which the amplifiers of FIGS. 2, 3 and 4 can be utilized in a microwave circuit.

In FIG. 5 there is shown a 3-port circulator 50 to which there is connected a source of microwave energy 51 and a utilization means or load 52 at the input and output ports, respectively. The third port of circulator 50 is connected to waveguide section 53. Waveguide section 53 represents the wave propagating structures designated as elements 20, 30, and 40 in FIGS. 2, 3, and 4, respectively; whereas box 54 represents the amplifier structure explained in connection with each of the embodiments. A shorting piston 55 is shown in the extreme end of waveguide section 53.

In operation, microwave energy is supplied to circulator 50 from source 51. The input energy is, in turn, applied to waveguide section 53 where it propagates therein in the direction of amplifier 54. A portion of the input wave energy is amplified and coupled back into waveguide 53. As explained above, the amplified wave energy propagates in both directions in waveguide 53. A portion of the amplified wave energy propagates down the guide to piston 55 where it is reflected. The position of piston 55 can be adjusted so that the wave energy thus reflected recombines in phase with the other portion of the amplified energy propagating toward the circulator. Thus, all of the amplified wave energy propagates back up guide 53 where it is applied to circulator 50. Due to the unidirectional transmission characteristics of circulator 50 all the amplified wave energy is coupled to the load 52.

In the foregoing description of the various embodiments the operation of the invention was described as a microwave amplifier. At this point it should be noted that the various embodiments can be made to function equally well as microwave oscillators. Whether the invention operates as an amplifier or as an oscillator is determined by the effective loading on the diode. This, in turn, is determined—in the illustrative embodiments—by the amount of coupling between the slot-diode combination and the signal wave transmission path.

It was mentioned above that it is preferable to operate in a frequency range that is between cut-off and approximately ten percent above the cut-off frequency of the transmission path. If oscillator action is desired, it can be achieved by operating the device at a frequency that is much higher than cut-off, or by otherwise decreasing the amount of coupling between the slots and the wave path.

Of course, if oscillator operation is desired, no external source of microwave energy is necessary. This being so, the embodiment of FIG. 5 may be simplified considerably, since there is no need for either source 51 or circulator 50. If operated as an oscillator, then, all that is necessary is to place the load 52 at the end of waveguide section 53 opposite piston 55. The biasing and tuning of the various embodiments is done in substantially the same manner as indicated hereinabove.

In all cases it is understood that the above-described arrangements are illustrative of a small number of the many possible specific embodiments which can represent applications of the principles of the present invention. Numerous and varied other arrangements can readily be devised in accordance with these principles by those skilled in the art without departing from the spirit and scope of the invention.

What is claimed is:

1. In combination, a conductively bounded waveguiding structure capable of supporting electromagnetic wave energy over a given band of frequencies, at least one slot in the wall of said structure being electromagnetically coupled thereto, a nonlinear impedance element mounted in each slot, said nonlinear impedance element displaying a negative dynamic resistance over a portion of its operating range, a cavity electromagnetically coupled to each slot, said cavity mounted external to said structure, the combination of each slot, nonlinear impedance element, and cavity being resonant at a frequency within said band of frequencies, and means for applying a bias voltage to each element.

2. The combination according to claim 1 wherein said nonlinear impedance element is a tunnel diode.

3. In combination, a hollow, rectangular waveguide supportive of electromagnetic wave energy over a given band of frequencies, a slot in one wall of said waveguide and electromagnetically coupled thereto, a nonlinear impedance element mounted in said slot, said nonlinear impedance element displaying a negative dynamic resistance over a portion of its operating range, a cavity electromagnetically coupled to said slot, said cavity mounted external to said waveguide, the combination of said slot, cavity and nonlinear impedance element being resonant at a frequency within said band of frequencies, and means for biasing said nonlinear impedance element.

4. The combination according to claim 3 wherein said nonlinear impedance element is a tunnel diode.

5. In combination, a hollow circular waveguide supportive of electromagnetic wave energy over a given band of frequencies in the $TE_{01}$ circular electric wave mode, a plurality of substantially identical rectangular slots symmetrically disposed around the wall of said guide, said slots being oriented with their longer dimension substantially parallel to the axis of said guide and their projections upon said axis coextensive, a nonlinear impedance element mounted in each slot between the longer sides thereof, said nonlinear impedance elements having a voltage-characteristic which includes a negative resistance region, at least one tunable cavity mounted adjacent to said slots and electromagnetically coupled thereto, and means for biasing each of said nonlinear impedance elements.

6. The combination according to claim 5 wherein said nonlinear impedance elements are tunnel diodes.

7. The combination according to claim 5 wherein the dimension of said circular waveguide is proportioned so that said waveguide is near cut-off for said electromagnetic wave energy.

8. In combination, a coaxial waveguide having an inner and outer conductor, said guide being supportive of electromagnetic wave energy over a given band of frequencies in the $TE_{01}$ coaxial electric wave mode, a plurality of substantially identical rectangular slots symmetrically disposed around said outer conductor, said slots being oriented with their longer dimension substantially parallel to the axis of said guide and their projections upon said axis coextensive, a nonlinear impedance element mounted in each slot between the longer sides thereof, said nonlinear impedance element having a voltage-current characteristic which includes a negative resistance region, at least one tunable cavity mounted adjacent to said slots and electromagnetically coupled thereto, and means for biasing each of said nonlinear impedance elements.

9. The combination according to claim 8 wherein said nonlinear impedance elements are tunnel diodes.

10. The combination according to claim 8 wherein the dimensions of said coaxial waveguide are proportioned so that said waveguide is near cut-off for said electromagnetic wave energy.

11. In combination, a conductively bounded signal wave transmission path, means for exciting said transmission path with wave energy of a given mode, a plurality of elongated slots disposed around the outer wall of said transmission path in a given transverse region, said slots having substantially equal cross-sectional dimensions, said slots being oriented so that their longer dimensions are substantially perpendicular to the electric current in said conductor, a nonlinear impedance element mounted across the longer sides of each of said slots, said impedance element having a voltage-current characteristic which includes a negative resistance region, a tunable cavity electromagnetically coupled to each of said slots, said cavities being mounted external to said transmission path, and means for biasing each of said nonlinear impedance elements.

12. A microwave amplifier comprising, in combination, a source of electromagnetic wave energy having frequency components extending over a given band of frequencies, a conductively bounded waveguiding structure capable of supporting electromagnetic wave energy over said band of frequencies, a three-port circulator, and utilization means, means for connecting a first port of said circulator to said source, means for connecting a second port of said circulator to said utilization means, means for connecting the third port of said circulator to a first end of said waveguiding structure, at least one slot in the wall of said waveguiding structure being electromagnetically coupled thereto, a nonlinear impedance element mounted in each slot, said nonlinear impedance element displaying a negative dynamic resistance over a portion of its operating range, a cavity electromagnetically coupled to each slot, said cavity mounted external to said structure, the combination of each slot, nonlinear impedance element and cavity being resonant at a frequency within said band of frequencies, means for applying a bias voltage to each element, and means for reflecting wave energy from the second end of said structure.

No references cited.